United States Patent
Gold et al.

(10) Patent No.: US 10,188,013 B1
(45) Date of Patent: Jan. 22, 2019

(54) APPARATUS, SYSTEM, AND METHOD FOR DEPLOYING DATA CENTER MODULES

(71) Applicant: Facebook, Inc., Menlo Park, CA (US)

(72) Inventors: Andrew Gold, Los Altos, CA (US); Scott C. Wiley, Los Altos, CA (US); Marco Antonio Magarelli, Sunnyvale, CA (US); Seung H. Park, Fremont, CA (US)

(73) Assignee: Facebook, Inc., Menlo Park, CA (US)

( * ) Notice: Subject to any disclaimer, the term of this patent is extended or adjusted under 35 U.S.C. 154(b) by 0 days.

(21) Appl. No.: 15/728,441

(22) Filed: Oct. 9, 2017

(51) Int. Cl.
| | |
|---|---|
| *H05K 7/14* | (2006.01) |
| *B25J 9/02* | (2006.01) |
| *B65G 1/04* | (2006.01) |
| *G05B 15/02* | (2006.01) |
| *G11B 17/22* | (2006.01) |
| *G11B 15/68* | (2006.01) |

(52) U.S. Cl.
CPC ............ *H05K 7/1489* (2013.01); *B25J 9/026* (2013.01); *B65G 1/0435* (2013.01); *G05B 15/02* (2013.01); *G11B 15/6835* (2013.01); *G11B 17/225* (2013.01)

(58) Field of Classification Search
CPC ..... H05K 7/1489; B25J 9/026; G11B 17/225; G11B 15/6835
See application file for complete search history.

(56) References Cited

U.S. PATENT DOCUMENTS

| | | | | |
|---|---|---|---|---|
| 5,966,266 | A * | 10/1999 | Kato | G11B 17/225 360/92.1 |
| 2003/0016504 | A1* | 1/2003 | Raynham | G11B 33/126 361/727 |
| 2012/0023370 | A1* | 1/2012 | Truebenbach | G11B 17/225 714/27 |
| 2013/0322223 | A1* | 12/2013 | Minemura | G11B 33/04 369/75.11 |
| 2017/0094828 | A1* | 3/2017 | Van Pelt | H05K 7/18 |
| 2017/0181306 | A1* | 6/2017 | Shaw | H05K 7/10 |
| 2018/0024771 | A1* | 1/2018 | Miller | H03M 7/40 711/154 |
| 2018/0215041 | A1* | 8/2018 | Morrill | B25J 9/0093 |

\* cited by examiner

Primary Examiner — Thomas Randazzo
(74) *Attorney, Agent, or Firm* — FisherBroyles, LLP

(57) ABSTRACT

A data-center-module deployment apparatus may include a gantry robot adapted to move a sliding element parallel to a face of an information technology rack, where the face of the information technology rack exposes information technology device modules stored by the information technology rack. The apparatus may also include at least one track that is coupled to the sliding element and that extends away from the sliding element and toward the face of the information technology rack. In addition to the track(s), the apparatus may include an engaging element that is adapted to move along the track(s) and to engage with one or more of the information technology device modules stored by the information technology rack, such that the engaging element is adapted to insert into the information technology rack and remove from the information technology rack one or more of the plurality of information technology device modules.

20 Claims, 15 Drawing Sheets

APPARATUS, SYSTEM, AND METHOD FOR DEPLOYING DATA CENTER MODULES

BACKGROUND

Demand for computational resources from organizations and individuals continues to grow. Increasingly, data centers meet this demand by providing large amounts of data processing and data storage capacity in a concentrated physical space. Some data centers may provide computing as a service, giving customers the flexibility to consume computational resources on an as-needed basis while sparing the customers the financial and administrative burdens of maintaining the underlying physical computing infrastructure. Other data centers may provide large-scale computation for a single organization. In either case, the optimization of data centers becomes increasingly central to computation as data centers grow and proliferate.

Optimizing data centers involves many factors: power consumption, cooling, device cost, device reliability, device administration (installing, configuring, maintaining, replacing, moving, and removing devices), scalability, redeployment flexibility, human environmental comfort, human accessibility to devices, physical plant construction and maintenance, and physical plant footprint are examples of such factors. Unfortunately, due to competing constraints (e.g., power consumption vs. cooling, scalability vs. physical plant footprint), optimizing data centers poses a difficult problem. However, due to the highly commoditized nature of computing, an improvement to data center design can unlock a tremendous amount of value for data center operators and consumers.

SUMMARY

As will be described in greater detail below, the instant disclosure generally relates to apparatuses, systems, and methods for deploying data center modules. In some examples, a data-center-module deployment apparatus may include a gantry robot adapted to move a sliding element parallel to a face of an information technology rack, where the face of the information technology rack exposes information technology device modules that are stored by the information technology rack and that thereby connect to and operate within a computing infrastructure. The apparatus may also include a track that is coupled to the sliding element and that extends away from the sliding element and toward the face of the information technology rack. In addition to the track, the apparatus may include an engaging element that is adapted to move along the track and to engage with one or more of the information technology device modules stored by the information technology rack, such that the engaging element is adapted to insert into the information technology rack and remove from the information technology rack one or more of the plurality of information technology device modules.

In some examples, the engaging element may include a pair of jaws adapted to engage with one or more of the information technology device modules.

In some embodiments, the track may be coupled to the sliding element via a tray. In these embodiments, the tray may include a pair of walls that extend along opposite sides of the track such that the engaging element is adapted to move in parallel with the pair of walls.

The engaging element may include any additional suitable elements. For example, the engaging element may include a pair of rollers, and each roller in the pair of rollers may be coupled to a corresponding jaw in the pair of jaws at an intermediate position of the corresponding jaw between a pivot point of the corresponding jaw and an engaging portion of the corresponding jaw that is adapted to engage with one or more of the information technology device modules. In some examples, the pair of rollers may constrict the pair of jaws to an engaged position when the pair of rollers are constrained by the pair of walls such that an engaged information technology device module moves with the engaging element as the engaging element moves along the track.

In some examples, the pair of walls may terminate at a proximal section of the tray such that the rollers do not constrict the pair of jaws to the engaged position when the engaging element is at the proximal section of the tray, thereby allowing the pair of jaws to open to the transitioning position and permitting a removed information technology device module to be disengaged from the gantry robot.

In some embodiments, the tray may include multiple tracks carrying multiple engaging elements. Additionally or alternatively, the sliding element may be coupled to a plurality of trays. In some examples, the gantry robot may include a motor that drives the sliding element along a frame of the gantry robot.

According to various embodiments, a corresponding data-center-module deployment system may include an information technology rack that stores information technology device modules that thereby connect to and operate within a computing infrastructure. The system may also include a gantry robot adapted to move a sliding element parallel to a face of the information technology rack, where the face of the information technology rack exposes the plurality of information technology device modules stored by the information technology rack. In addition, the system may include a track that is coupled to the sliding element and that extends away from the sliding element and toward the face of the information technology rack. The system may also include an engaging element that is adapted to move along the track and to engage with one or more of the plurality of information technology device modules stored by the information technology rack, such that the engaging element is adapted to insert into the information technology rack and remove from the information technology rack one or more of the of information technology device modules.

The data-center-module deployment system may be installed, oriented, and/or arranged in any suitable manner. For example, the face of the information technology rack may be perpendicular to a floor on which the information technology rack stands. In some examples, the information technology rack may extend from the floor to a ceiling of a data center containment area. In some examples, the face of the information technology rack may be parallel to a floor that supports the information technology rack.

The information technology device modules may take any suitable form. In some examples, the information technology device modules may have a rectangular cuboid exterior.

In some examples, the data-center-module deployment system may also include a module-dispensing apparatus that is reachable by the engaging element of the gantry robot and that provides one or more additional information technology device modules adapted for insertion by the gantry robot into the information technology rack.

In some embodiments, the data-center-module deployment system may include a conveyor located in a position reachable by the engaging element of the gantry robot such that when the engaging element disengages with a removed information technology device module the removed information technology device module transfers to the conveyor.

In some examples, the engaging element may include a pair of jaws adapted to engage with a target information technology device module when each jaw enters a corresponding recess defined by a surface of the target information technology device module.

In addition to the various systems and devices described herein, the instant disclosure presents, by way of example, methods associated with data-center-module deployment systems. For example, a method may include coupling a sliding element to a frame of a gantry robot such that the gantry robot is adapted to move the sliding element parallel to a face of an information technology rack, where the face of the information technology rack exposes a plurality of information technology device modules that are stored by the information technology rack and that thereby connect to and operate within a computing infrastructure. The method may also include coupling a track to the sliding element, such that the track extends away from the sliding element and toward the face of the information technology rack. In addition, the method may include coupling an engaging element to the track such that the engaging element is adapted to move along the track and to engage with one or more of the information technology device modules stored by the information technology rack, and such that the engaging element is adapted to insert into the information technology rack and remove from the information technology rack one or more of the information technology device modules.

Features from any of the above-mentioned embodiments may be used in combination with one another in accordance with the general principles described herein. These and other embodiments, features, and advantages will be more fully understood upon reading the following detailed description in conjunction with the accompanying drawings and claims.

BRIEF DESCRIPTION OF THE DRAWINGS

The accompanying drawings illustrate a number of exemplary embodiments and are a part of the specification. Together with the following description, these drawings demonstrate and explain various principles of the instant disclosure.

Figure 1:
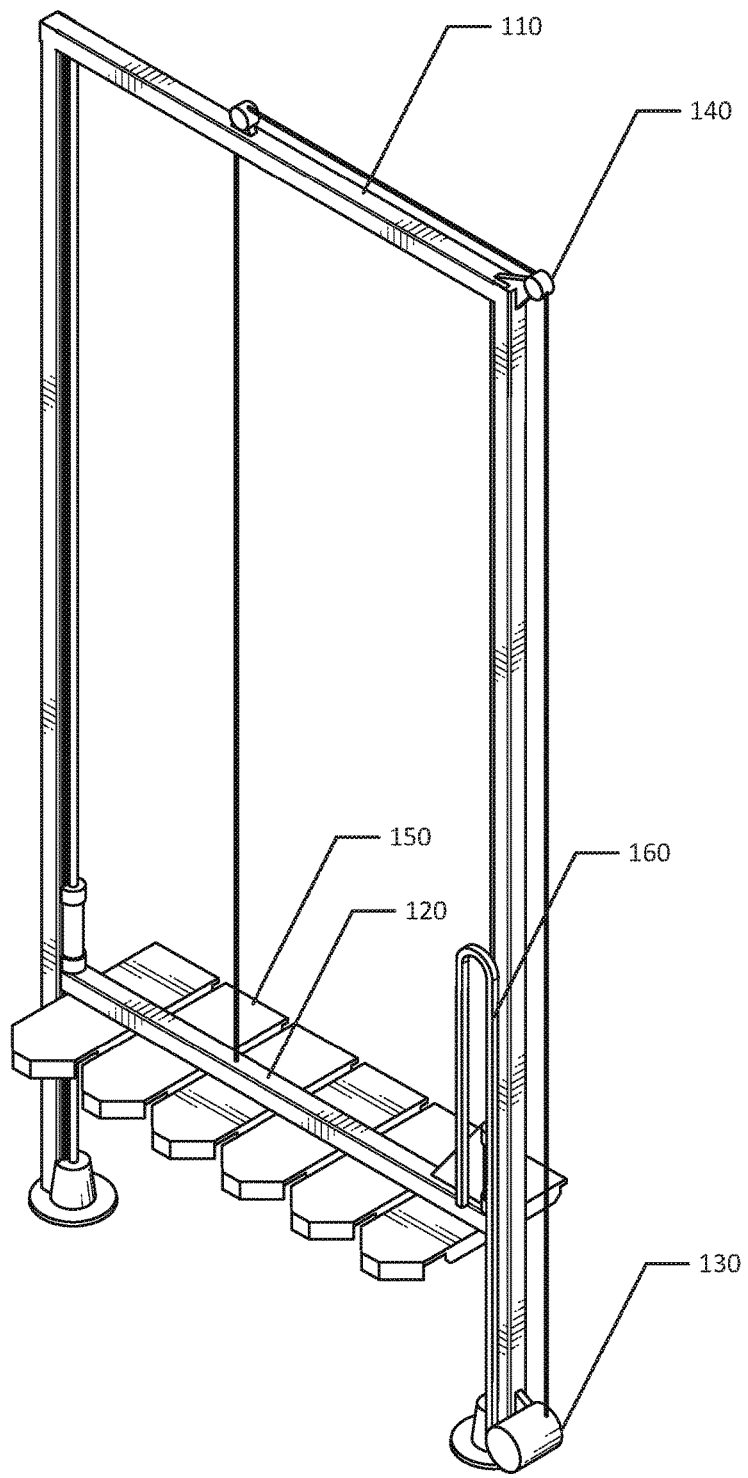
FIG. 1 is a perspective view of a module deployment apparatus.

Throughout the drawings, identical reference characters and descriptions indicate similar, but not necessarily identical, elements. While the exemplary embodiments described herein are susceptible to various modifications and alternative forms, specific embodiments have been shown by way of example in the drawings and will be described in detail herein. However, the exemplary embodiments described herein are not intended to be limited to the particular forms disclosed. Rather, the instant disclosure covers all modifications, equivalents, and alternatives falling within the scope of the appended claims.

DETAILED DESCRIPTION OF EXEMPLARY EMBODIMENTS

The present disclosure describes various apparatuses, systems, and methods for deploying modules in data centers. These deployment mechanisms may utilize gantry robots to remove modules from data center racks, insert modules into data center racks and/or otherwise manipulate modules within data center racks. The deployment mechanisms disclosed herein may also provide various features and advantages over conventional approaches to data center management. For example, the deployment mechanisms disclosed herein may allow for quick deployment of various computing devices within data centers (in some examples, deploying long rows of devices at once). In addition, the deployment mechanisms disclosed herein may facilitate more efficient arrangements of data center facilities. For example, the deployment mechanisms disclosed herein may facilitate the deployment of modules to data center racks that would ordinarily be difficult for humans to reach (e.g., tall racks, closely spaced racks, racks in enclosed areas, racks placed horizontally or otherwise non-perpendicularly to the floor). In some examples, the deployment mechanisms may facilitate module deployment from within hot aisles (that would typically be unsuitable for human work). Thus, the deployment mechanisms described herein may provide potential savings in terms of human labor, physical plant footprint, and/or energy spent on cooling.

In addition, the deployment mechanisms described herein may simplify or remove design constraints from data center layouts. In some examples, the deployment mechanisms described herein may make quickly rearranging and/or replacing modules more practical (thereby potentially improving flexibility, scalability, and/or disaster recovery in data centers). In some examples, the deployment mechanisms described herein may make as-needed deployment adjustments more practical, thereby potentially improving data center performance. Furthermore, by reducing time spent on deploying modules, the deployment mechanisms described herein may free time for information technology workers to concentrate on higher-level considerations in data center configuration and maintenance.

The following will provide, with reference to FIGS. 1-9 and 14, examples of devices for deploying data center modules. In addition, the discussion associated with FIGS. 10-13 will provide examples of systems for deploying data center modules. Finally, the discussion corresponding to FIG. 15 will provide examples of methods for manufacturing, assembling, configuring, installing, and/or using the module deployment mechanisms presented herein.

Figure 2:
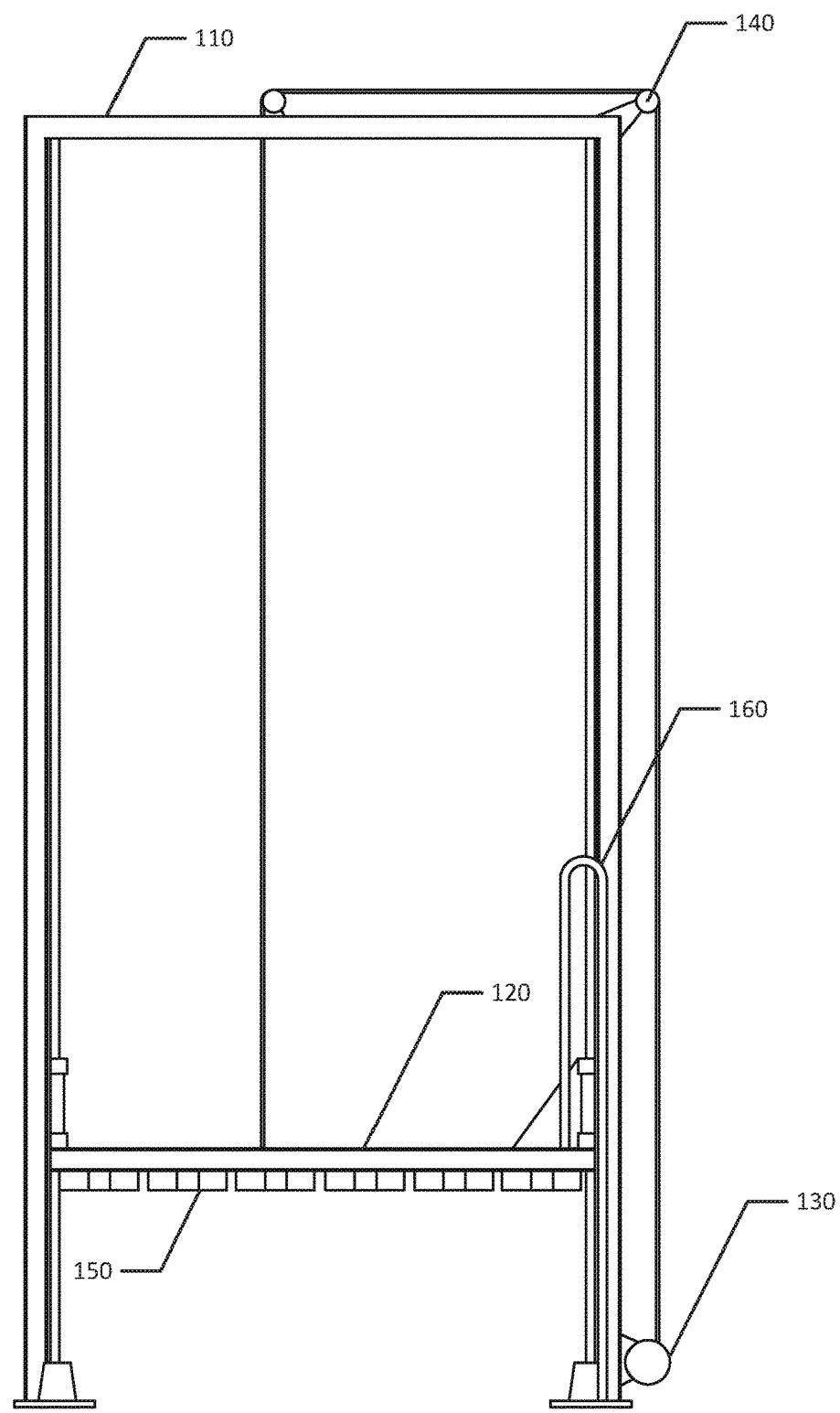
FIG. 2 is a front view of a module deployment apparatus.

FIGS. 1-2 illustrate a module deployment apparatus 100 for deploying modules to data center racks. Apparatus 100 may include a gantry robot 110. The term "gantry," as used herein, may refer to any rigid structure adapted to provide movement for an operative assembly across an area defined by the rigid structure. Accordingly, the term "gantry robot," as used herein, may refer to any gantry adapted to provide such movement for an operative assembly to perform programmable, automated tasks. For example, gantry robot 110 may be adapted to move a sliding element 120 parallel to the face of an information technology rack that exposes information technology devices that are stored by the information technology rack and that thereby connect to and operate within a computing infrastructure. As used herein, the term "computing infrastructure" may refer to any collection of devices and/or components that may collectively provide computational resources. A computing infrastructure with modular components may be used in any of a variety of contexts. In some examples, a computing infrastructure may provide computation in a cloud computing environment. Additionally or alternatively, a computing infrastructure may provide computation in a parallel computing environment. In some examples, a computing infrastructure may represent a collection of underlying physical computing resources that may be allocation and/or virtualized to provide one or more logical and/or virtual computing resources.

In one example, a motor 130 may drive sliding element along the frame of gantry robot 110. For example, motor 130 may drive a pulley 140 to move sliding element 120 up or down the frame of gantry robot 110.

In some examples, a track may be coupled to sliding element 120. The track may extend away from sliding element 120 and toward the face of the information technology rack. For example, sliding element 120 may support one or more trays, including a tray 150. In this example, tray 150 may include a track (e.g., on the underside of tray 150, not visible in FIGS. 1-2) that runs perpendicular to sliding element 120. Thus, the track may be coupled to sliding element 120 via tray 150.

As will be explained in greater detail below, apparatus 100 may also include an engaging element (e.g., on the underside of tray 150, not visible in FIGS. 1-2) that is adapted to move along the track and to engage with one or more of the information technology device modules stored by the information technology rack, such that the engaging element is adapted to insert into the information rack and remove from the information technology rack one or more of the information technology device modules. In some examples, as will be discussed in greater detail below, the engaging element may include a jaw-based element that may engage with modules. While the use of jaws for the engaging element is provided by way of example, any of a variety of interfaces may be employed to enable engaging element to engage with modules. In some examples, the engaging element may include an adapter that allows the use of a variety of engaging interfaces. For example, one engaging element and/or interface coupled to an engaging element may be swapped with another engaging element and/or interface coupled to the engaging element. In some examples, an engaging element may be configured with and/or include a tool for inserting modules into and/or removing modules from a rack. In some examples, an engaging element may be configured with and/or include a tool for performing one or more functions related to the maintenance, configuration, and/or operation of data center racks, modules or equipment located within a data center or data centers.

As shown in FIGS. 1-2, apparatus 100 may additionally include a conduit 160 that may convey power and/or signals to the engaging element (e.g., via sliding element 120 and/or tray 150) to enable the engaging element to move along the track and/or engage with one or more information technology device modules.

Gantry robot 110 may remove or insert an information technology device module in any of a variety of contexts. For example, gantry robot 110 may remove an information technology device module from an information technology rack in response to a signal from the information technology rack that the information technology device module is to be removed (e.g., a signal indicating that the information technology device module is defective). Likewise, gantry robot 110 may insert an information technology device module into an information technology rack in response to a signal from the information technology rack that a slot within the information technology rack is available. In some examples, gantry robot 110 may receive instructions to insert, remove, move, and/or replace modules from a data center coordination system that maintains a map of information technology device modules and information technology racks within a data center.

Figure 3:
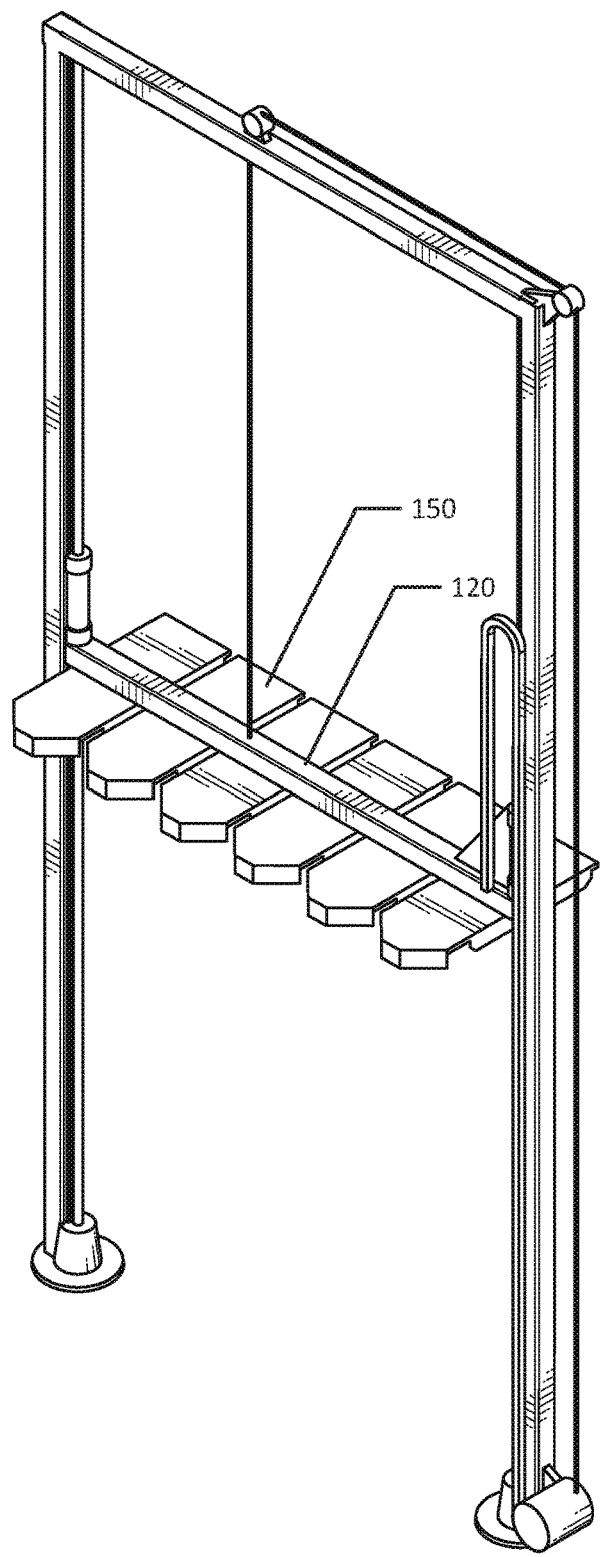
FIG. 3 is a perspective view of a module deployment apparatus with a sliding element in a partially lifted state.

FIG. 3 shows module deployment apparatus 100 in a state different from that depicted in FIGS. 1-2. As shown in FIG. 3, sliding element 120 may have been lifted (e.g., by the operation of motor 130 and pulley 140), thereby lifting tray 150 and the track and the engaging element on the underside of tray 150. In this manner, the engaging element (and, e.g., other engaging elements also supported by sliding element 120 via tray 150 and other trays) may reach information technology device modules at different heights of the information technology rack.

Figure 4:
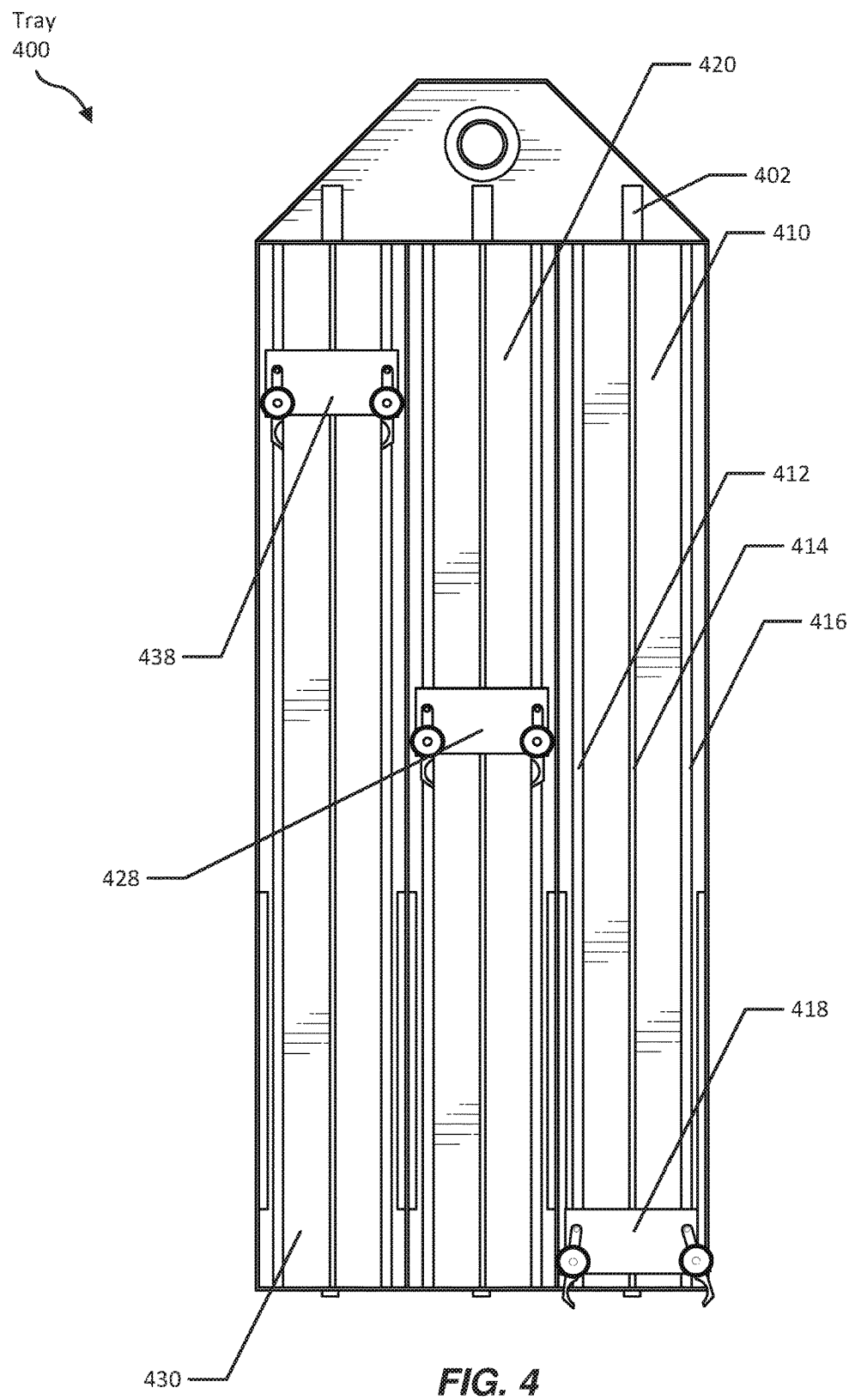
FIG. 4 is a bottom view of a tray for a module deployment apparatus.

FIG. 4 shows the underside of a tray 400 (e.g., corresponding to tray 150 depicted in FIGS. 1-3). As shown in FIG. 4, tray 400 may include a track 410, a track 420, and a track 430, along which may slide engaging elements 418, 428, and 438, respectively. In one example, each track may include multiple rails (e.g., that run through corresponding channels in the engaging elements). For example, track 410 may include a rail 412, a leadscrew 414 or actuator, and a rail 416 that run through three respective channels in engaging element 418. In one example, a motor 402 may rotate leadscrew or an actuator 414 (or an actuator) to drive engaging element 418 back and forth along track 410.

Figure 5A:
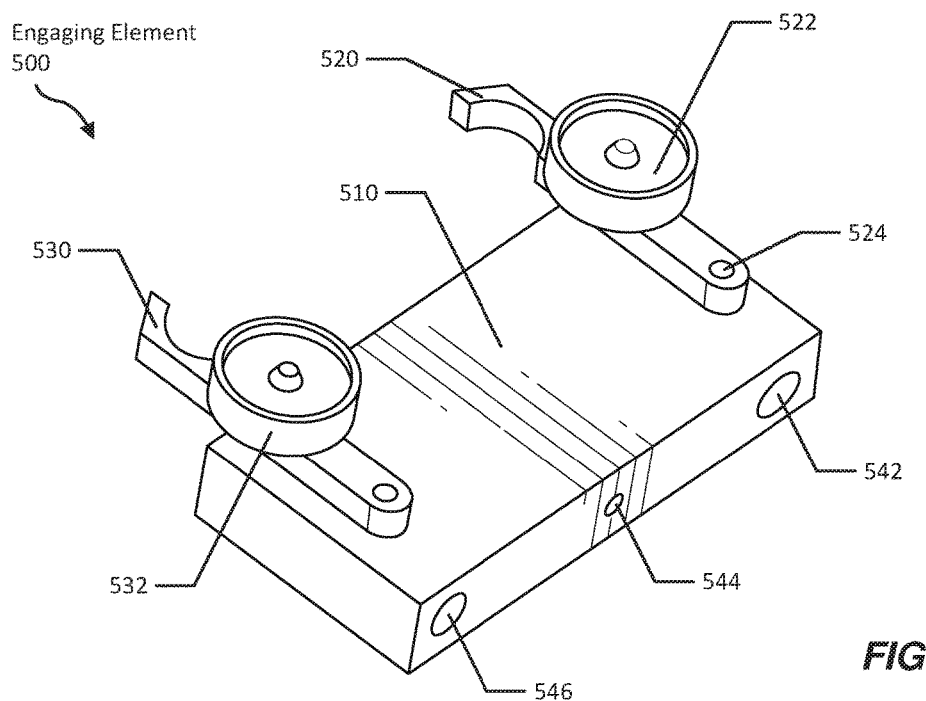
FIG. 5A is a perspective view of an engaging element for a module deployment apparatus in an engaged state.
Figure 5B:
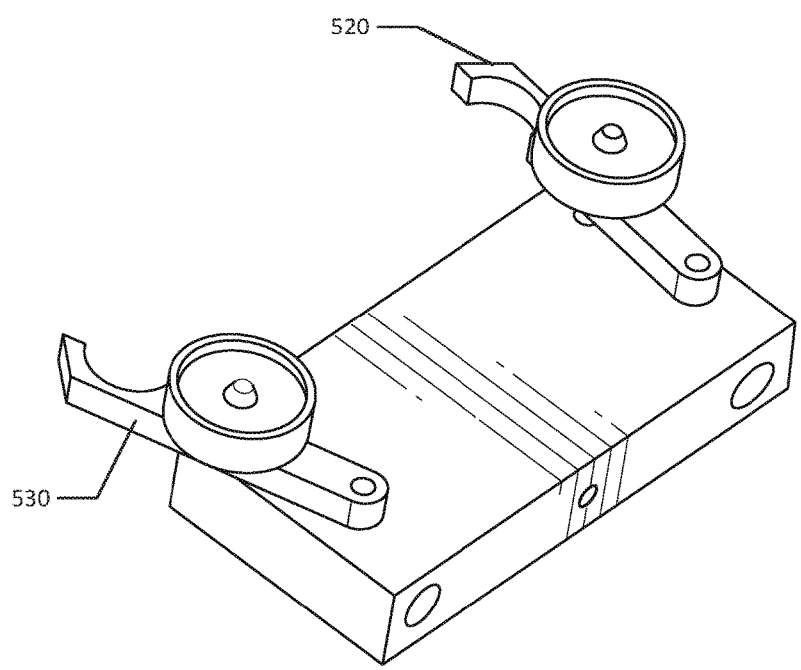
FIG. 5B is a perspective view of the engaging element of FIG. 5A in a transitioning state.

FIGS. 5A and 5B show an engaging element 500 (e.g., corresponding to engaging elements 418, 428, and/or 438 in FIG. 4). As shown in FIG. 5A, engaging element 510 may include a body 510 that defines channels 542, 544, and 546 running through body 510. In addition, engaging element 510 may include a pair of jaws (e.g., a jaw 520 and a jaw 530) coupled to body 510. Jaws 520 and 530 may be adapted to engage with one or more information technology device modules (e.g., in order to insert or remove one or more modules into or from a rack). Jaws 520 and 530 may be coupled to body 510 at pivot points such that jaws 520 and 530 can swing open. For example, jaw 520 may be coupled to body 510 at a pivot 524. In addition, engaging element 500 may include rollers 522 and 532 coupled to jaws 520 and 530, respectively. Rollers 522 and 532 may be coupled to jaws 520 and 530 in any suitable manner. For example, roller 522 may be coupled to jaw 520 at an intermediate position of jaw 520 between pivot 524 of jaw 520 and the engaging portion of jaw 520 that is adapted to engage with (e.g., to directly grasp) one or more information technology device modules.

As shown in FIG. 5A, jaws 520 and 530 may be positioned in an engaged position. In the engaged position, jaws 520 and 530 may be engaged with an information technology device module such that the information technology device module moves with engaging element 500. In addition, with jaws 520 and 530 in the engaged position engaging element 500 may move up or down a track (e.g., without jaws 520 or 530 colliding with portions of a tray holding the track).

FIG. 5B shows engaging element 510 in a transitioning state due to jaws 520 and 530 having pivoted away from body 510. In the transitioning state, jaws engaging element 510 may engage or disengage (e.g., via spring and/or cam action) from an information technology device module (e.g., by preparing to grasp or releasing a grasp from the information technology device module).

Figure 6:
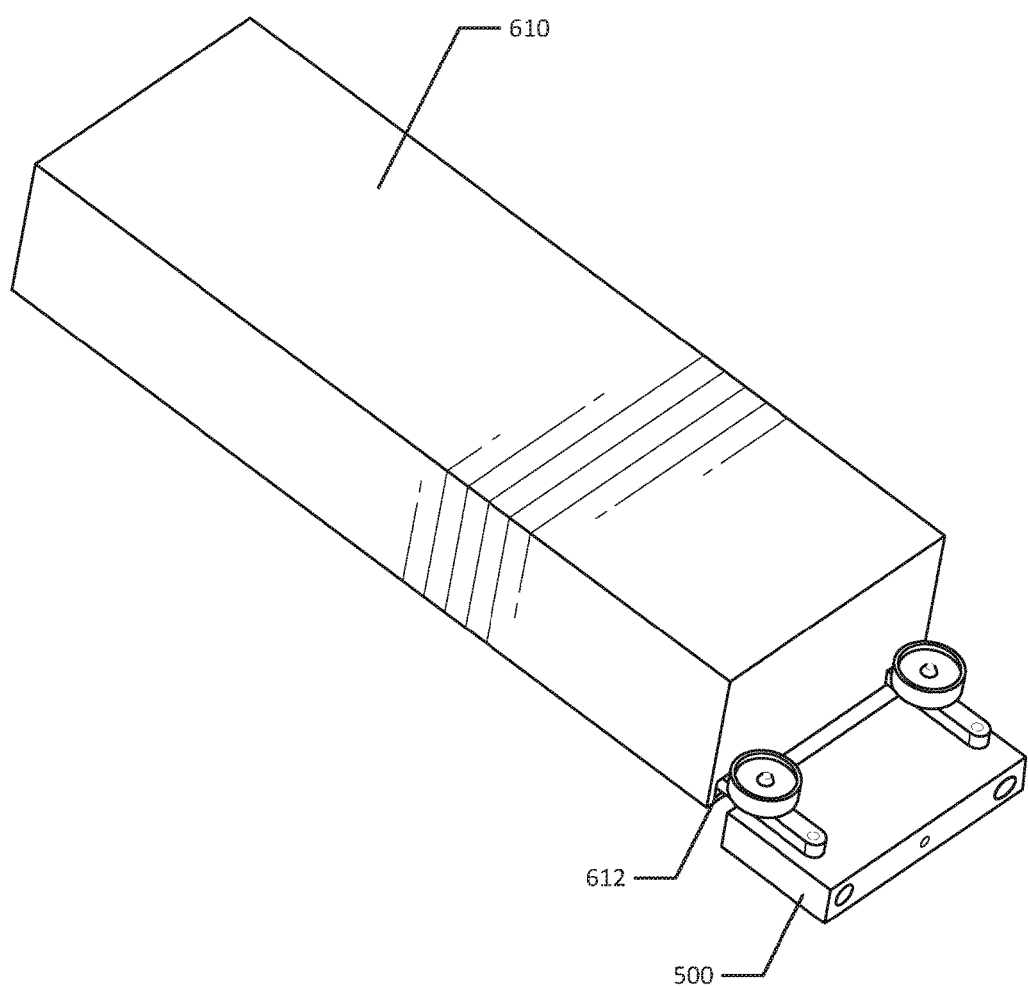
FIG. 6 is a perspective view of an engaging element engaged with a module.

FIG. 6 shows engaging element 500 engaged with an information technology device module 610. As used herein, the term "information technology device module" may refer to any modular device that may include and/or form a part of a computing system and/or an information technology rack. Examples of information technology device modules include, without limitation, servers, power supplies or other power modules, network switches, and battery backup units. In some examples, a heterogeneous set of information technology device modules may operate within a single information technology rack. For example, a single information technology rack may connect servers, power supplies, network switches, and battery backup units within a computing infrastructure. An information technology rack may connect information technology device modules to a computing infrastructure in any suitable manner. For example, an information technology rack may include one or more cables and/or connectors that connect to stored information technology device modules and that transmit data and/or power between information technology device modules and/or between an information technology device module and another system.

An information technology device module may take any suitable form. In some examples, information technology device modules may have a rectangular cuboid exterior (i.e., approximately rectangular cuboid, allowing for interfaces at the surface that facilitate engagement with a gantry robot engaging element and/or that facilitate connections to cables and/or other connective elements). As may be appreciated in light of further description below, a rectangular cuboid exterior may facilitate efficient packing within an information technology rack, insertion and/or removal by a gantry robot, manipulation through a tray of a gantry robot, and/or dispensing by a module-dispensing apparatus.

As shown in FIG. 6, jaws 520 and 530 of engaging element 500 may be inserted into recesses in the surface of module 610. For example, jaws 520 and 530 may be adapted to engage with module 610 when each jaw enters a corresponding recess defined by a surface of module 610. For example, jaw 530 may be inserted into recess 612 of module 610. In some examples, In some examples, the hooks at the ends of jaws 520 and 530 may hook around an interior surface of module 610, preventing jaws 520 and 530 from exiting the recesses of module 610 and instead keeping engaging element 500 engaged with module 610 as long as engaging element 500 is in an engaged state with jaws 520 and 530 closed.

Figure 7:
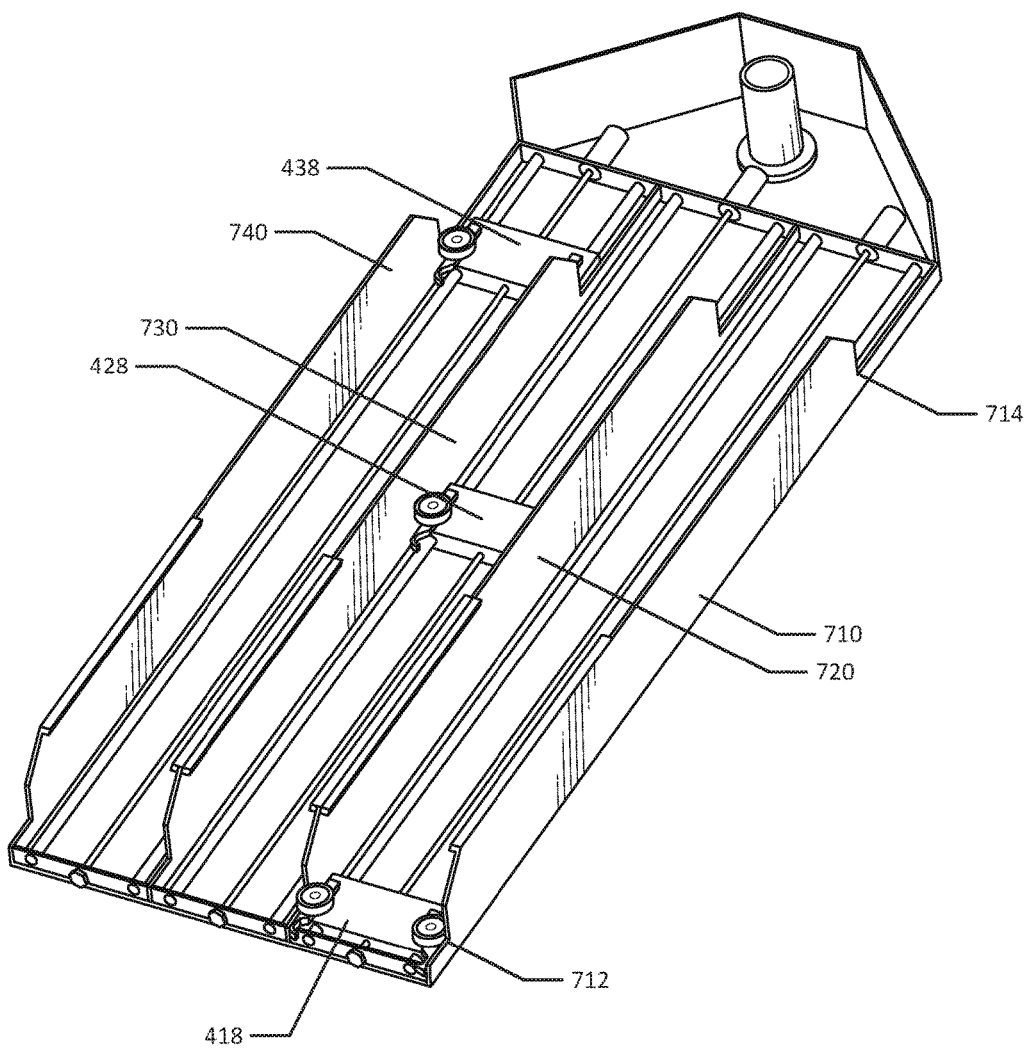
FIG. 7 is a perspective view of a tray for a module deployment apparatus.

FIG. 7 provides a perspective view of tray 400. As shown in FIG. 7, tracks 410, 420, and 430 may in part be defined by walls 710, 720, 730, and 740. For example, walls 710 and 720 may run along the respective sides of a portion of track 410. Walls 710 and 720 may extend along opposite sides of track 410 such that engaging element 418 is adapted to move in parallel with walls 710 and 720. Likewise, walls 720 and 730 may run along the respective sides of a portion of track 420. Similarly, walls 730 and 740 may run along the respective sides of a portion of track 430.

In some examples, the rollers coupled to the engaging elements may roll along the sides of the walls as the engaging elements move back and forth along the tracks. For example, the rollers of engaging element 428 may roll along walls 720 and 730 as engaging element 428 moves along track 420. As may be appreciated by the depiction in FIG. 7, the rollers of an engaging element may restrict the jaws of the engaging element while the rollers are in contact with the walls running in parallel with the track. For example, walls 720 and 730 may restrict the rollers of engaging element 428 and the rollers, in term may restrict the jaws of engaging element 428 from opening further. In this manner, while between walls, engaging elements may remain in an engaged state. Thus, the pair of rollers may constrict the pair of jaws to an engaged position when the pair of rollers are constrained by the pair of walls such that an engaged information technology device module moves with the engaging element as the engaging element move along the track. However, as shown in FIG. 7, the walls following the tracks may not extend the full length of the track. Instead, each pair of walls may terminate at a distal end of the tray such that the rollers do not constrict the pair of jaws to the engaged position when the engaging element is at the distal end of the tray, thereby allowing the pair of jaws to open to a transitioning position that permits engagement and disengagement between the engaging element and a target information technology device module. For example, wall 710 may extend only from a position 712 to a position 714. Thus, as the center of the rollers of engaging element 418 move forward past position 712, the jaws of engaging element 418 may be free to open and engaging element 418 may enter a transitioning state (e.g., in preparation to grasp a module).

Likewise, the pair of walls along a track may terminate at a proximal section of the tray such that the rollers do not constrict the pair of jaws to the engaged position when the engaging element is at the proximal section of the tray, thereby allowing the pair of jaws to open to the transitioning position and permitting a removed information technology device module to be dropped from the gantry robot. For example, as engaging element 438 moves backward such that the rollers and jaws of engaging element 438 are no longer constrained by walls 730 and 740, the jaws of engaging element 438 may be free to open and engaging element 438 may enter a transitioning state (e.g., releasing any module previously engaged with engaging element 438).

Figure 8:
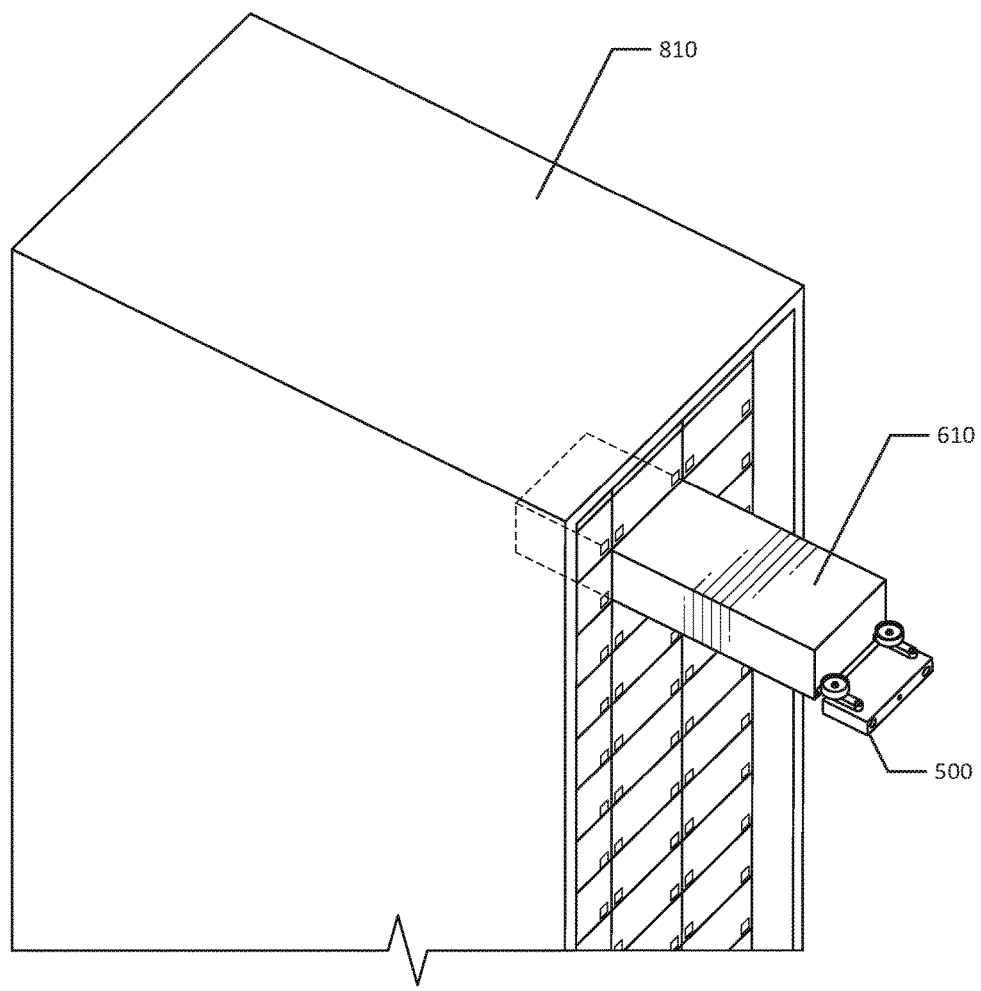
FIG. 8 is a perspective view of an engaging element removing a module from an information technology rack.

FIG. 8 shows an information technology rack 810 storing information technology device modules (in a grid formation) and an engaging element 500 engaged with an information technology device module 610. As used herein, the term "information technology rack" may refer to any structure for housing multiple information technology device modules. In some examples, an information technology rack may also house and/or provide support for one or more cables that connect to information technology device modules. In some examples, an information technology rack may house information technology device modules in a grid pattern. As shown in FIG. 8, engaging element 500 may remove information technology device module 610 by moving away from information technology rack 810. Likewise, engaging element 500 may insert information technology device module 610 into information technology rack 810 by moving toward information technology rack 810. In some examples, information technology rack 810 and/or information technology device module 610 may have one or more blind connectors such that when information technology device module 610 is fully inserted into information technology rack 810, one or more blind connectors on technology device module 610 may connect to one or more corresponding blind connectors in information technology rack 810 (e.g., to transmit power and/or data to and/or from information technology device module 610).

Figure 9:
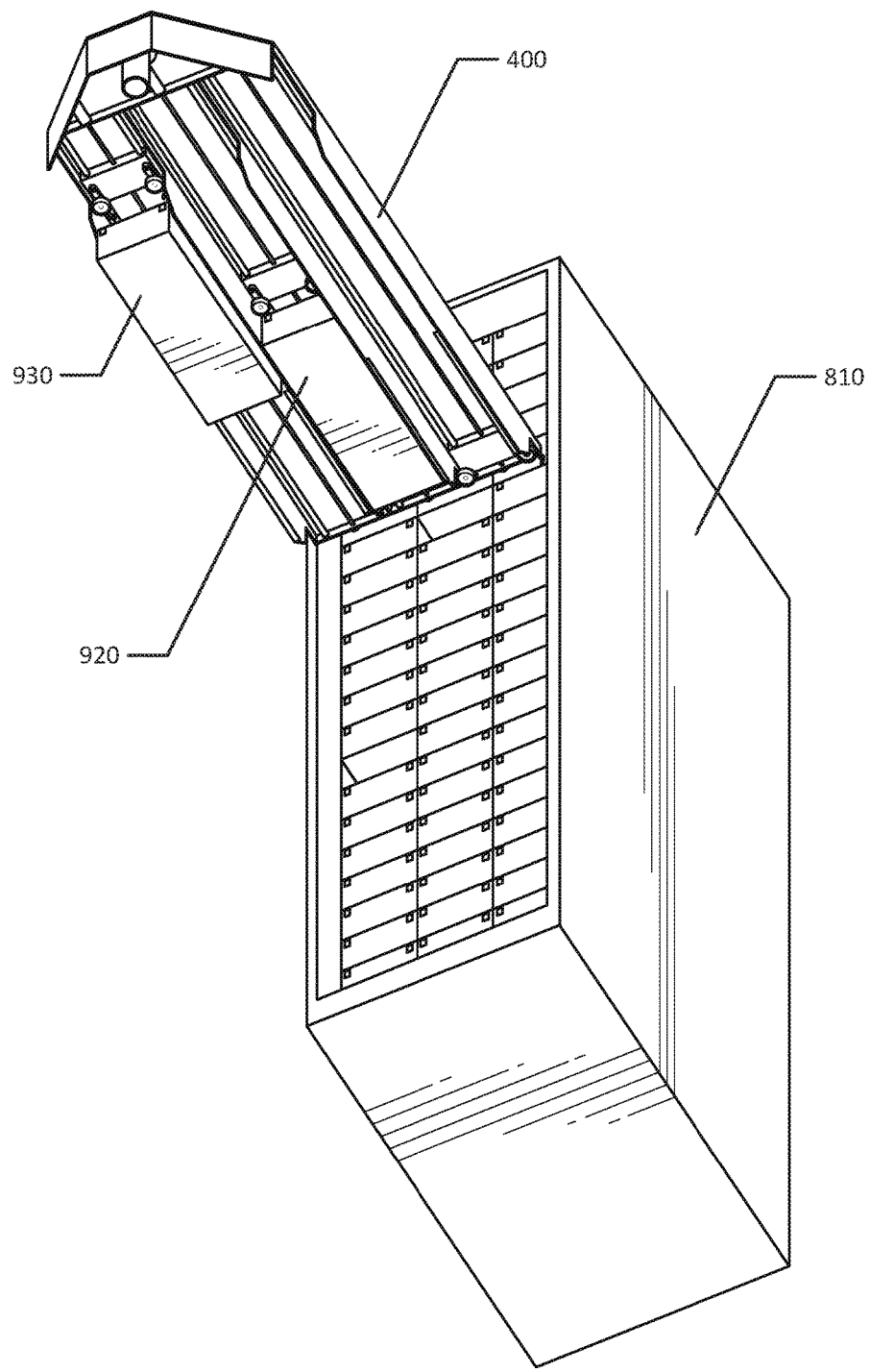
FIG. 9 is a perspective view of a tray with multiple engaging elements in various states with respect to an information technology rack.

FIG. 9 shows tray 400 positioned in front of information technology rack 810. As shown in FIG. 9, two information technology device modules may have been removed from rack 810. For example, module 920 may have been removed by an engaging element in tray 400. Module 930 may have been removed by another engaging element in tray 400 and may have disengaged from module 930, allowing module 930 to drop from tray 400. Apparatus 100 may drop a module such as module 930 in any suitable location. In some examples, a conveyor may be located in a position reachable by the engaging element of the gantry robot such that when the engaging element disengages with a removed information technology device module the removed information technology device module transfers to the conveyor. The module may then travel along a path defined by the conveyor (e.g., to be taken for inspection, repair, disposal, replacement, reconfiguration; or to be conveyed to another part of a data center where another gantry robot may take up the module to insert into an information technology rack).

Figure 10:
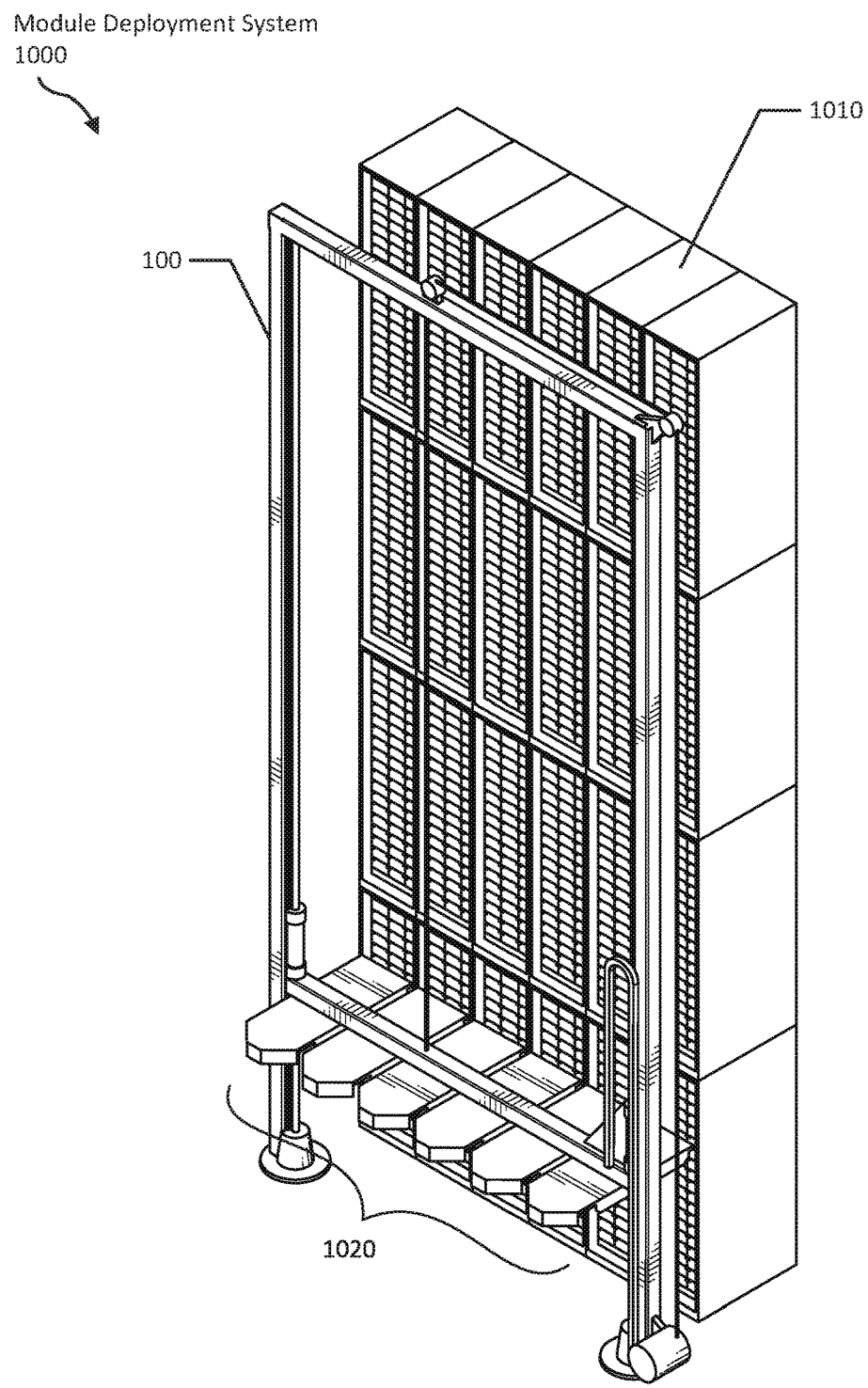
FIG. 10 is a perspective view of a system with a module deployment apparatus and an information technology rack.

FIG. 10 shows an information technology rack 1010. As seen in FIG. 10, information technology rack 1010 may include multiple smaller rack modules (e.g., a wall four modules high and six modules across). As seen in FIG. 10, apparatus 100 may be positioned in front of information technology rack 1010 such that the six trays 1020 are aligned with information technology rack 1010. In this manner, apparatus 100 may be able to access multiple information technology device modules at one time. For example, each of the trays 1020 may have three tracks (e.g., as shown in FIGS. 4, 7, and 9), each with an engaging element. Accordingly, the six trays 1020 may collectively include 18 tracks. While some examples discussed herein show a gantry robot with six trays, each with three tracks, it may be appreciated that other configurations may be employed. Generally, any suitable number of trays may be coupled to the sliding element of a single gantry robot, and a tray may include multiple tracks carrying multiple engaging elements. By way of additional examples, the gantry robot may use a single tray with three tracks, a single tray with six tracks, three trays each with three tracks, nine trays each with two tracks, or three trays each with six tracks. Thus, in various examples, apparatus 100 may deploy an entire row of modules (e.g., 18 modules) at once. Additionally or alternatively, apparatus 100 may selectively deploy and/or remove modules to or from any of the 18 corresponding slots at a given position for sliding element 120. In this manner, systems described herein may rapidly deploy, reconfigure, replace, and/or remove targeted modules in data center racks.

While various examples described herein discuss a gantry robot with multiple engaging elements operating in connection with one or more trays, a gantry robot may employ multiple engaging elements (e.g., coupled to a sliding element) without a tray. For example, a set of tools may be coupled, directly or indirectly, to a sliding element of a gantry robot. In some examples, some of these tools may include engaging elements. In some embodiments, the set of tools may include engaging elements of the same type (e.g., with the same design, type of interface, and/or mode of operation). Additionally or alternatively, the set of tools may include engaging elements of different types (e.g., with different designs, types of interface, and/or modes of operation). In some examples, the set of tools may include one or more adapters. In one example, the adapter may allow one or more tools and/or interfaces to be decoupled from adapters and other tools and/or interfaces (e.g., of a different type) to be coupled to an adapter or adapters.

The gantry robot may deploy modules to an information technology rack of any suitable dimension. In some examples, the information technology rack may extend twenty, twenty-four, twenty-eight, thirty-two, forty, or eighty feet high. The gantry robot may extend to a corresponding height. While an information technology rack of such height may be impractical using traditional methods of deployment and maintenance, the systems described herein may facilitate the efficient use of a physical plant footprint (e.g., by facilitating building upward rather than outward). In some examples, using tall information technology racks may reduce the number of floors otherwise required to reach a given volume of useable space within a physical plant, thereby potentially decreasing construction costs. In some examples, the information technology rack may extend from the floor to the ceiling of a data center containment area (e.g., of a single level of a physical plant or an entire interior of a physical plant). By reaching to the ceiling, the information technology racks described herein may be used in place of and/or as an integral part of structural supports for a physical plant. In some examples, the information technology racks discussed herein may not extend completely to the ceiling. In these examples, the frame of the gantry robot may extend up one side of the information technology rack and down the other side of the information technology rack, allowing the sliding element to access either side of the rack. In some examples, the entire gantry robot may move (e.g., on a track along the floor, on wheels, etc.) from one information technology rack to another information technology rack, allowing a single gantry robot to deploy modules to multiple information technology racks. Additionally or alternatively, the entire gantry robot and/or elements of the gantry robot may move up and over (or move to the side of) one or more racks and descend to service different racks.

Figure 11:
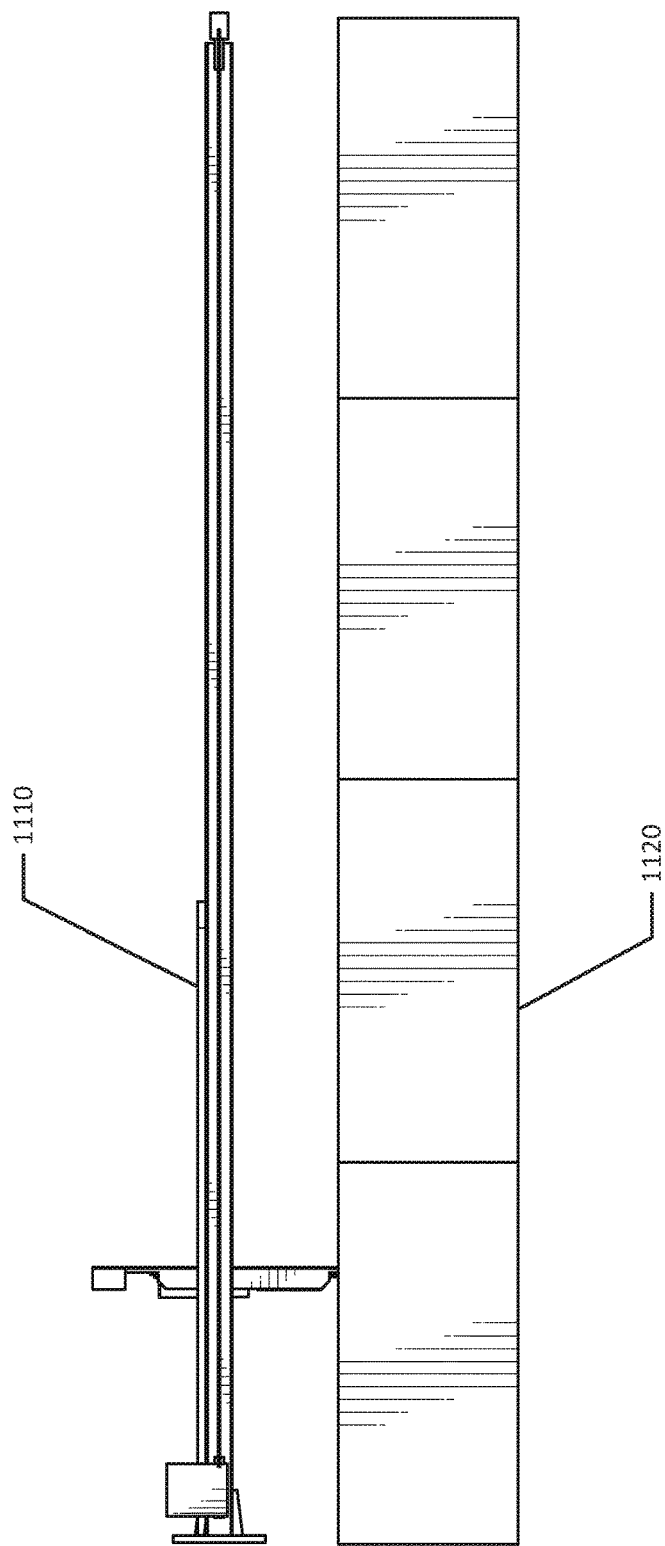
FIG. 11 is a side view of a system with a horizontally oriented module deployment apparatus and information technology rack.
Figure 12:
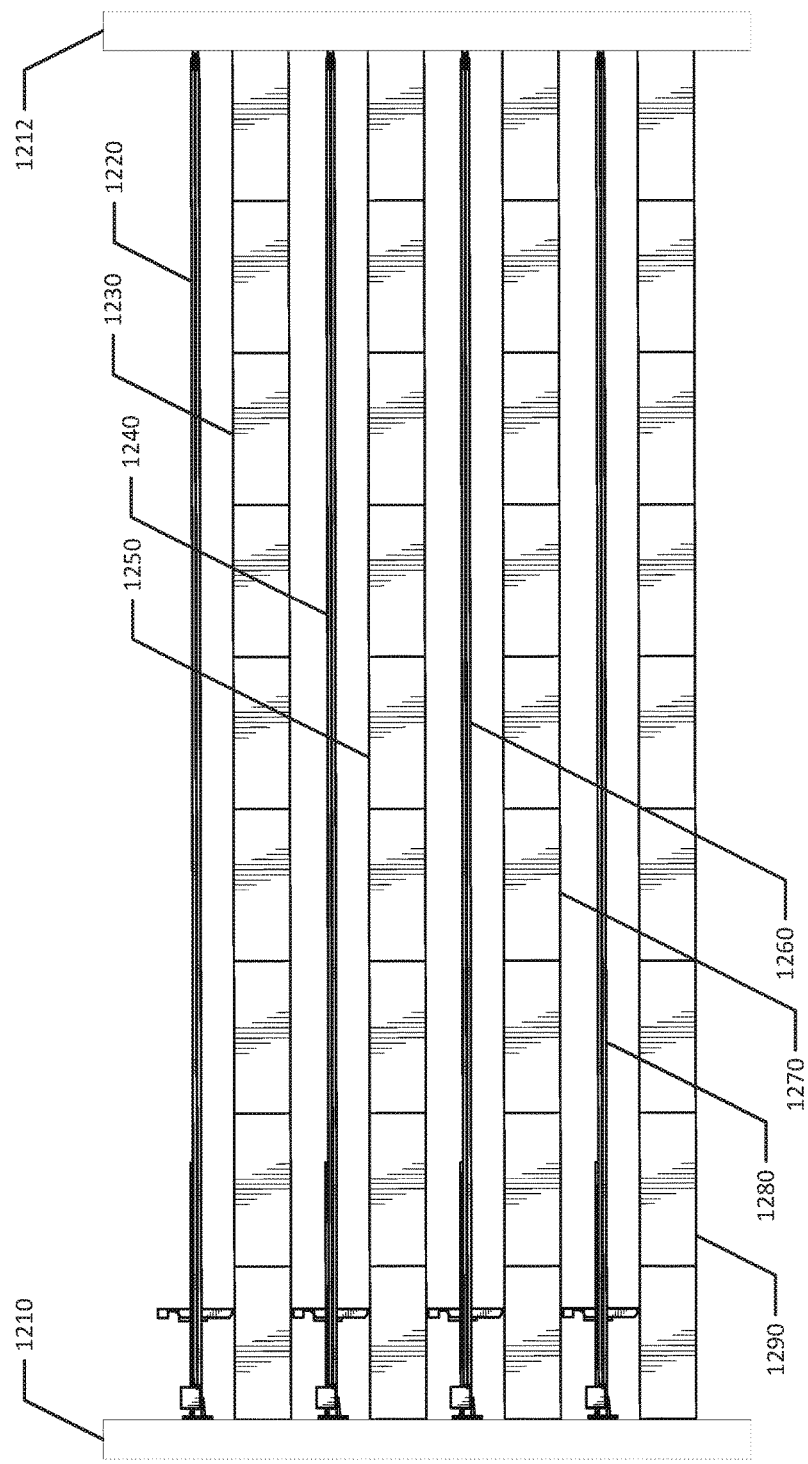
FIG. 12 is a side view of a system with multiple horizontally oriented module deployment apparatuses and information technology racks.

As discussed herein, in some examples the face of the information technology rack may be perpendicular to the floor on which the information technology rack stands. In some examples, the gantry robot may operate from a non-vertical orientation. For example, the face of the information technology rack may be parallel to a floor that supports the information technology rack. As shown in FIG. 11, an information technology rack 1120 may span horizontally (i.e., parallel to the floor) and a gantry robot 1110 may be positioned parallel to information technology rack 1120. In some examples, such a horizontal configuration may allow for horizontal stacking of information technology racks. For example, as shown in FIG. 12, information technology racks 1230, 1250, 1270, and 1290 may be oriented horizontally in a vertical stack (e.g., supported at either end by walls 1210 and 1212). In this example, gantry robots 1220, 1240, 1260, and 1280 may service racks 1230, 1250, 1270, and 1290, respectively.

Figure 13:
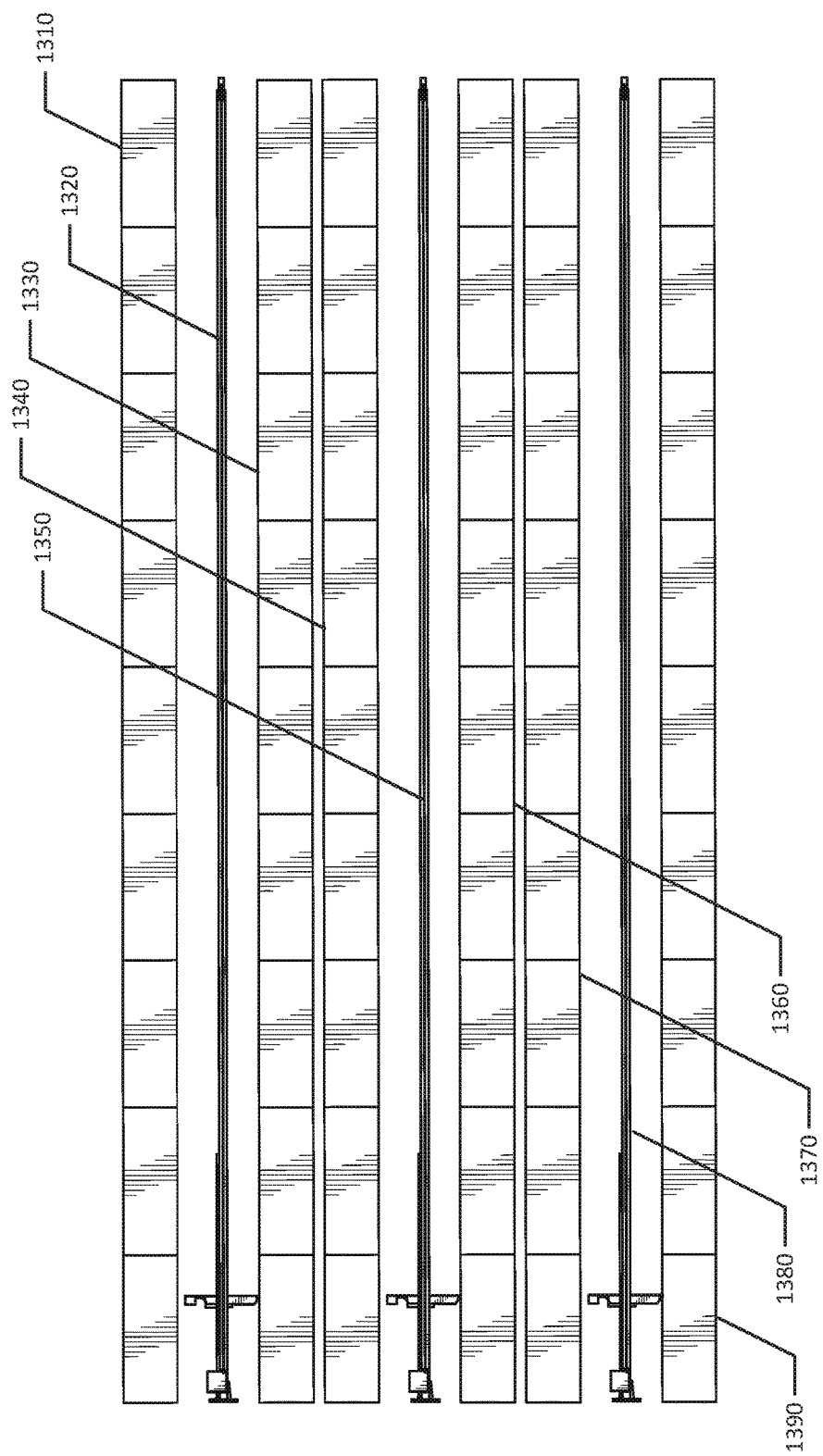
FIG. 13 is a side view of a system with multiple horizontally oriented module deployment apparatuses and information technology racks.

FIG. 13 provides another example of a rack arrangement making use of a horizontal orientation. As shown in FIG. 13, racks 1310, 1330, 1340, 1360, 1370, and 1390 may be oriented horizontally and be positioned vertically one relative to another. In this example, gantry robots may be placed between successive pairs of racks. For example, a gantry robot 1320 may be positioned between racks 1310 and 1330; a gantry robot 1350 may be positioned between racks 1340 and 1360; and a gantry robot 1380 may be positioned between racks 1370 and 1390. In this manner, a single gantry robot may provision modules for two racks. In some examples, the successive pairs of racks may be positioned back-to-back. In addition, such a configuration may facilitate the formation of separate hot and cold aisles, where, e.g., heat originating from the racks is ventilated into the spaces between the racks where the robot gantries are while cooler air circulates in the spaces between the racks where there are no robot gantries (or vice versa). Generally, the gantry robot may be located in any suitable position within a data center. In some examples, the gantry robot may operate in a data center hot aisle into which the information technology rack ventilates air heated by one or more of the plurality of information technology device modules. In this manner, the gantry robot may perform tasks in spaces that may not be suitable for human work, thereby potentially allowing for more space-efficient and/or energy-efficient data center layouts.

Figure 14:
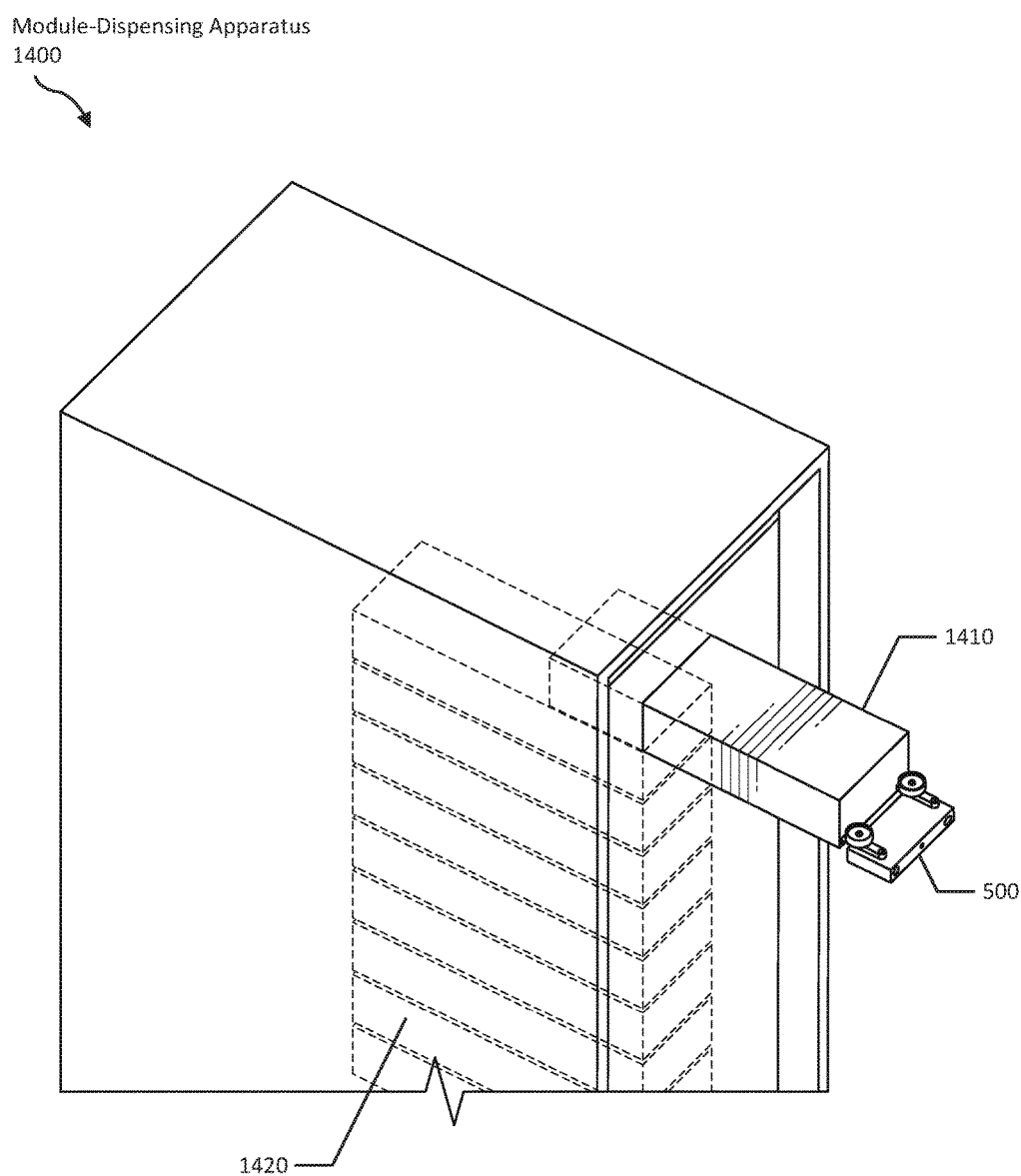
FIG. 14 is a perspective view of a module-dispensing apparatus.

FIG. 14 shows an example module-dispensing apparatus 1400. As shown in FIG. 14, engaging element 500 may remove a module 1410 from apparatus 1400 (e.g., in order to install module 1410 in an information technology rack). In some examples, apparatus 1400 may be adapted to replace a removed module with a new module to dispense. For example, once module 1410 is removed from apparatus 1400, a stack 1420 of modules (no longer blocked by module 1410) may rise, allowing access to the top module in stack 1420. In other configurations, the orientation may be reversed, and a stack from above may descend when a module is removed from a module-dispensing apparatus. Module-dispensing apparatus 1400 may be positioned in any suitable location within a data center. For example, apparatus 1400 may be reachable by the engaging element of the gantry robot and provide one or more additional information technology device modules adapted for insertion by the gantry robot into one or more information technology racks. In some examples, module-dispensing apparatus 1400 may be positioned within an information technology rack, providing direct access to the modules by a gantry robot positioned in front of the information technology rack.

Figure 15:
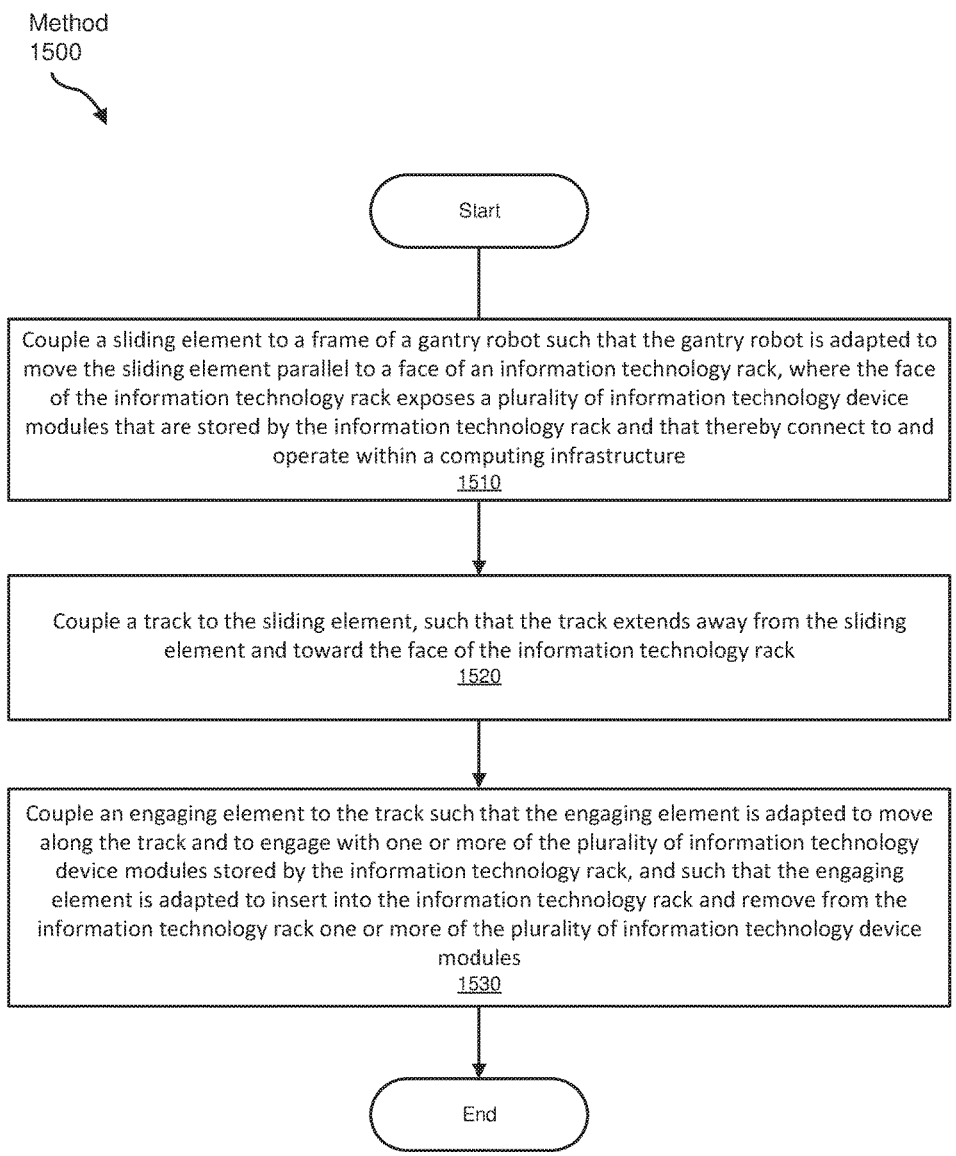
FIG. 15 is a flow diagram of a method for assembling a module deployment apparatus.

FIG. 15 shows, by way of example, a method for manufacturing, assembling, using, adjusting, or otherwise configuring or creating the systems and devices presented herein. In particular, FIG. 15 illustrates a flow diagram of a method 1500 for assembling a module deployment apparatus. As shown in FIG. 15, at step 1510 a sliding element may be coupled to a frame of a gantry robot such that the gantry robot is adapted to move the sliding element parallel to a face of an information technology rack, where the face of the information technology rack exposes a plurality of information technology device modules stored by the information technology rack. For example, sliding element 120 may be coupled to gantry robot 110 such that gantry robot 110 may move sliding element 120 up and down the frame of gantry robot 110 (e.g., as shown in FIGS. 1 and 3).

At step 1520, a track may be coupled to the sliding element, such that the track extends away from the sliding element and toward the face of the information technology rack. For example, track 410, as a part of tray 400, may be coupled to sliding element 120, such that track 410 extends away from sliding element 120 and toward the face of information technology rack 1010.

At step 1530, an engaging element may be coupled to the track such that the engaging element is adapted to move along the track and to engage with one or more of the plurality of information technology device modules stored by the information technology rack, and such that the engaging element is adapted to insert into the information technology rack and remove from the information technology rack one or more of the plurality of information technology device modules. For example, engaging element 418 may be coupled to track 410 such that engaging element 418 is adapted to move along track 410 and to engage with one or more information technology device modules stored by information technology rack 1010, and such that engaging element 418 is adapted to insert into information technology rack 1010 and remove from information technology rack 1010 one or more information technology device modules (e.g., such as module 610).

The process parameters and sequence of the steps described and/or illustrated in FIG. 15 are given by way of example only and can be varied as desired. For example, while the steps illustrated and/or described herein may be shown or discussed in a particular order, these steps do not necessarily need to be performed in the order illustrated or discussed to assemble, manufacture, or use apparatus 100. The various exemplary methods described and/or illustrated in FIG. 15 may also omit one or more of the steps described or illustrated herein or include additional steps in addition to those disclosed.

As discussed throughout the instant disclosure, the disclosed methods, systems, and devices may provide one or more advantages over traditional data center configurations. For example, module-deployment devices described herein may allow for quick deployment of various computing devices within data centers (in some examples, deploying long rows of devices at once). In addition, the deployment mechanisms disclosed herein may facilitate more efficient arrangements of data center facilities. For example, the deployment mechanisms disclosed herein may facilitate the deployment of modules to data center racks that would ordinarily be difficult for humans to reach (e.g., tall racks, closely spaced racks, racks in enclosed areas, racks placed horizontally or otherwise non-perpendicularly to the floor). In some examples, the deployment mechanisms may facilitate module deployment from within hot aisles (that would typically be unsuitable for human work). Thus, the deployment mechanisms described herein may provide potential savings in terms of human labor, physical plant footprint, and/or energy spent on cooling.

The preceding description has been provided to enable others skilled in the art to best utilize various aspects of the exemplary embodiments disclosed herein. This exemplary description is not intended to be exhaustive or to be limited to any precise form disclosed. Many modifications and variations are possible without departing from the spirit and scope of the instant disclosure. The embodiments disclosed herein should be considered in all respects illustrative and not restrictive. Reference should be made to the appended claims and their equivalents in determining the scope of the instant disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

What is claimed is:

1. A data-center-module deployment apparatus comprising:
    a gantry robot adapted to move a sliding element parallel to a face of an information technology rack, wherein the face of the information technology rack exposes a plurality of information technology device modules that are stored by the information technology rack and that thereby connect to and operate within a computing infrastructure;
    a track that is coupled to the sliding element and that extends away from the sliding element and toward the face of the information technology rack; and
    an engaging element that is adapted to move along the track and to engage with one or more of the plurality of information technology device modules stored by the information technology rack, such that the engaging element is adapted to insert into the information technology rack and remove from the information technology rack one or more of the plurality of information technology device modules.

2. The data-center-module deployment apparatus of claim 1, wherein the engaging element comprises a pair of jaws adapted to engage with one or more of the plurality of information technology device modules.

3. The data-center-module deployment apparatus of claim 2, wherein:
    the track is coupled to the sliding element via a tray; and
    the tray comprises a pair of walls that extend along opposite sides of the track such that the engaging element is adapted to move in parallel with the pair of walls.

4. The data-center-module deployment apparatus of claim 3, wherein the engaging element comprises a pair of rollers, each of the pair of rollers being coupled to a corresponding jaw in the pair of jaws at an intermediate position of the corresponding jaw between a pivot point of the corresponding jaw and an engaging portion of the corresponding jaw that is adapted to engage with one or more of the plurality of information technology device modules.

5. The data-center-module-deployment apparatus of claim 4, wherein the pair of rollers constrict the pair of jaws to an engaged position when the pair of rollers are constrained by the pair of walls such that an engaged information technology device module moves with the engaging element as the engaging element moves along the track.

6. The data-center-module deployment apparatus of claim 5, wherein the pair of walls terminate at a distal end of the tray such that the rollers do not constrict the pair of jaws to the engaged position when the engaging element is at the distal end of the tray, thereby allowing the pair of jaws to open to a transitioning position that permits engagement and disengagement between the engaging element and a target information technology device module.

7. The data-center-module deployment apparatus of claim 6, wherein the pair of walls terminate at a proximal section of the tray such that the rollers do not constrict the pair of jaws to the engaged position when the engaging element is at the proximal section of the tray, thereby allowing the pair of jaws to open to the transitioning position and permitting a removed information technology device module to be dropped from the gantry robot.

8. The data-center-module deployment apparatus of claim 3, wherein the tray comprises a plurality of tracks carrying a plurality engaging elements.

9. The data-center-module deployment apparatus of claim 3, wherein the sliding element is coupled to a plurality of trays.

10. The data-center-module deployment apparatus of claim 1, wherein the gantry robot further comprises a motor that drives the sliding element along a frame of the gantry robot.

11. A data-center-module deployment system comprising:
    an information technology rack that stores a plurality of information technology device modules that thereby connect to and operate within a computing infrastructure;
    a gantry robot adapted to move a sliding element parallel to a face of the information technology rack, wherein the face of the information technology rack exposes the plurality of information technology device modules stored by the information technology rack;
    a track that is coupled to the sliding element and that extends away from the sliding element and toward the face of the information technology rack; and
    an engaging element that is adapted to move along the track and to engage with one or more of the plurality of information technology device modules stored by the information technology rack, such that the engaging element is adapted to insert into the information technology rack and remove from the information technology rack one or more of the plurality of information technology device modules.

12. A data-center-module deployment system of claim 11, wherein the face of the information technology rack is perpendicular to a floor on which the information technology rack stands.

13. The data-center-module deployment system of claim 12, wherein the information technology rack extends from the floor to a ceiling of a data center containment area.

14. The data-center-module deployment system of claim 11, wherein the face of the information technology rack is parallel to a floor that supports the information technology rack.

15. The data-center-module deployment system of claim 11, wherein the gantry robot operates in a data center hot aisle into which the information technology rack ventilates air heated by one or more of the plurality of the information technology device modules.

16. The data-center-module deployment system of claim 11, wherein each of the plurality of information technology device modules comprises a rectangular cuboid exterior.

17. The data-center-module deployment system of claim 11, further comprising a module-dispensing apparatus that is reachable by the engaging element of the gantry robot and that provides one or more additional information technology device modules adapted for insertion by the gantry robot into the information technology rack.

18. The data-center-module deployment system of claim 11, further comprising a conveyor located in a position reachable by the engaging element of the gantry robot such that when the engaging element disengages with a removed information technology device module the removed information technology device module transfers to the conveyor.

19. The data-center-module deployment system of claim 11, wherein the engaging element comprises a pair of jaws adapted to engage with a target information technology device module when each jaw enters a corresponding recess defined by a surface of the target information technology device module.

20. A method comprising:
coupling a sliding element to a frame of a gantry robot such that the gantry robot is adapted to move the sliding element parallel to a face of an information technology rack, wherein the face of the information technology rack exposes a plurality of information technology device modules that are stored by the information technology rack and that thereby connect to and operate within a computing infrastructure;
coupling a track to the sliding element, such that the track extends away from the sliding element and toward the face of the information technology rack; and
coupling an engaging element to the track such that the engaging element is adapted to move along the track and to engage with one or more of the plurality of information technology device modules stored by the information technology rack, and such that the engaging element is adapted to insert into the information technology rack and remove from the information technology rack one or more of the plurality of information technology device modules.

* * * * *

UNITED STATES PATENT AND TRADEMARK OFFICE
CERTIFICATE OF CORRECTION

PATENT NO. : 10,188,013 B1
APPLICATION NO. : 15/728441
DATED : January 22, 2019
INVENTOR(S) : Andrew Gold et al.

Page 1 of 1

It is certified that error appears in the above-identified patent and that said Letters Patent is hereby corrected as shown below:

In the Claims

Column 13, Line 54, Claim 5, delete "data-center-module-deployment" and insert -- data-center-module deployment --, therefor.

Signed and Sealed this
Ninth Day of April, 2019

Andrei Iancu
*Director of the United States Patent and Trademark Office*